United States Patent
Mizuno et al.

(12)

(10) Patent No.: US 12,272,476 B2
(45) Date of Patent: Apr. 8, 2025

(54) PHOTODETECTION ELEMENT AND RECEIVER

(71) Applicant: TDK CORPORATION, Tokyo (JP)

(72) Inventors: Tomohito Mizuno, Tokyo (JP);
Hideaki Fukuzawa, Tokyo (JP);
Tetsuya Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 486 days.

(21) Appl. No.: 17/508,570

(22) Filed: Oct. 22, 2021

(65) Prior Publication Data

US 2022/0068537 A1    Mar. 3, 2022

(30) Foreign Application Priority Data

Oct. 26, 2020 (JP) ................................ 2020-178887
Aug. 5, 2021 (JP) ................................ 2021-129257

(51) Int. Cl.
| | |
|---|---|
| *H01F 10/32* | (2006.01) |
| *G01R 33/09* | (2006.01) |
| *G11B 5/39* | (2006.01) |
| *H10N 50/10* | (2023.01) |
| *H10N 50/85* | (2023.01) |

(52) U.S. Cl.
CPC ....... *H01F 10/3254* (2013.01); *G01R 33/093* (2013.01); *G01R 33/098* (2013.01); *G11B 5/3903* (2013.01); *H10N 50/85* (2023.02); *H10N 50/10* (2023.02); *Y10T 428/32* (2015.01)

(58) Field of Classification Search
None
See application file for complete search history.

(56) References Cited

U.S. PATENT DOCUMENTS

| | | | | |
|---|---|---|---|---|
| 6,010,780 A | * | 1/2000 | Nakayama | ........ G11B 11/10586 |
| | | | | 369/13.5 |
| 6,028,786 A | * | 2/2000 | Nishimura | .............. G11C 11/15 |
| | | | | 365/171 |
| 6,925,261 B2 | | 8/2005 | Haruyama | |
| 7,285,338 B2 | * | 10/2007 | Yamashita | .............. H01F 10/28 |
| | | | | 428/668 |
| 9,842,874 B2 | | 12/2017 | Nakata | |

(Continued)

FOREIGN PATENT DOCUMENTS

| | | |
|---|---|---|
| JP | 2001-292107 A | 10/2001 |
| JP | 2012-230143 A | 11/2012 |

(Continued)

OTHER PUBLICATIONS

Jun-Yang Chen et al., "All-Optical Switching of Magnetic Tunnel Junctions with Single Subpicosecond Laser Pulses", Physical Review Applied 7, 021001 (2017).

*Primary Examiner* — Kevin M Bernatz
(74) *Attorney, Agent, or Firm* — Oliff PLC

(57) ABSTRACT

A photodetection element includes: a first ferromagnetic layer configured to be irradiated with light; a second ferromagnetic layer; and a spacer layer sandwiched between the first ferromagnetic layer and the second ferromagnetic layer, wherein the first ferromagnetic layer includes a first region in contact with the spacer layer and a second region disposed in a position farther from the space layer than the first region, the first region is made of CoFeB alloy, and the second region is a magnetic material containing Fe and Gd as major constituent elements.

8 Claims, 6 Drawing Sheets

(56) References Cited

U.S. PATENT DOCUMENTS

| | | | |
|---|---|---|---|
| 10,840,435 B2* | 11/2020 | Sonobe et al. | H01F 10/3272 |
| 11,703,380 B2* | 7/2023 | Fukuzawa | H01F 10/325 |
| | | | 250/215 |
| 11,869,989 B2* | 1/2024 | Mizuno | G02B 6/305 |
| 2001/0040713 A1 | 11/2001 | Haruyama | |
| 2012/0299133 A1* | 11/2012 | Son | H10N 50/10 |
| | | | 257/E29.323 |
| 2013/0042081 A1* | 2/2013 | Park | G11C 11/1659 |
| | | | 711/E12.001 |
| 2014/0169082 A1* | 6/2014 | Worledge | G11C 11/161 |
| | | | 365/158 |
| 2014/0284539 A1* | 9/2014 | Eeh | H10N 50/01 |
| | | | 257/4 |
| 2015/0129997 A1* | 5/2015 | Tang | G11C 11/161 |
| | | | 257/427 |
| 2015/0333839 A1 | 11/2015 | Li et al. | |
| 2016/0308123 A1 | 10/2016 | Siddik et al. | |
| 2017/0110650 A1* | 4/2017 | Park | H10B 61/22 |
| 2019/0051700 A1* | 2/2019 | Kim | H10N 50/01 |
| 2019/0148626 A1 | 5/2019 | Honma et al. | |
| 2020/0161535 A1* | 5/2020 | Lin | H01F 10/3254 |
| 2020/0341079 A1* | 10/2020 | Swerts | H10B 61/00 |
| 2021/0134380 A1* | 5/2021 | Noh | H10N 50/80 |
| 2021/0318395 A1* | 10/2021 | Ueki | H10N 50/85 |
| 2022/0131020 A1* | 4/2022 | Mizuno | G02B 6/4206 |
| 2022/0178741 A1* | 6/2022 | Fukuzawa | H01F 10/3254 |
| 2022/0208820 A1* | 6/2022 | Fukuzawa | H10N 50/10 |
| 2022/0231181 A1* | 7/2022 | Yamane | H10N 50/10 |
| 2022/0317397 A1* | 10/2022 | Shibata | G02B 6/4274 |
| 2023/0301196 A1* | 9/2023 | Mizuno | G01S 7/4861 |
| | | | 257/295 |
| 2023/0304856 A1* | 9/2023 | Fukuzawa | H04B 10/40 |
| 2023/0341260 A1* | 10/2023 | Nojiri | H10N 50/10 |
| 2024/0103277 A1* | 3/2024 | Fukuzawa | G02B 27/0093 |

FOREIGN PATENT DOCUMENTS

| | | | |
|---|---|---|---|
| JP | 2018133474 A | * | 8/2018 |
| JP | 2019-068078 A | | 4/2019 |
| JP | 2019-091881 A | | 6/2019 |

* cited by examiner

PHOTODETECTION ELEMENT AND RECEIVER

BACKGROUND

The present invention relates to a photodetection element and a receiver.

Priority is claimed on Japanese Patent Application No. 2020-178887, filed on Oct. 26, 2020, and Japanese Patent Application No. 2021-129257, filed on Aug. 5, 2021, the contents of which are incorporated herein by reference.

With the spread of the Internet, an amount of communication has increased dramatically and the importance of optical communication is significantly increasing. Optical communication is a communication means configured to convert an electrical signal into an optical signal and perform transmission and reception using the optical signal.

For example, Patent Document 1 describes a receiving device configured to receive an optical signal using a photodiode. The photodiode is, for example, a pn junction diode using a pn junction of a semiconductor or the like. In addition, Patent Document 2 describes an optical sensor using a pn junction of a semiconductor and an image sensor using the optical sensor.

PATENT DOCUMENTS

[Patent Document 1] Japanese Unexamined Patent Application, First Publication No. 2001-292107
[Patent Document 2] U.S. Pat. No. 9,842,874, Specification

SUMMARY

Photodetectors using semiconductor pn junctions are widely used. However, a new photodetector is required for further development. In addition, there is a demand for highly efficient photodetection capable of converting light into electrical signals.

It is desirable to provide a photodetection element having high light detection ability.

The following means is provided.

(1): According to the first aspect, there is provided a photodetection element including: a first ferromagnetic layer configured to be irradiated with light; a second ferromagnetic layer; and a spacer layer sandwiched between the first ferromagnetic layer and the second ferromagnetic layer, wherein the first ferromagnetic layer includes a first region in contact with the spacer layer and a second region disposed in a position farther from the space layer than the first region, the first region is made of CoFeB alloy, and the second region is a magnetic material containing Fe and Gd as major constituent elements.

(2): The photodetection element according to the above-described aspect, may further includes an intermediate layer between the first region and the second region, wherein the intermediate layer may contain one or more elements selected from a group consisting of Mo, Ru, Ta, W and Pt.

(3): In the photodetection element according the above-described aspect, the second ferromagnetic layer may include a third region in contact with the spacer layer and a fourth region containing boron and disposed in a position farther from the space layer than the third region, and the third region may be free of boron or a concentration of boron in the third region is less than a concentration of boron in the fourth region.

(4): In the photodetection element according the above-described aspect, a concentration of boron in the first region may be more than a concentration of boron in the second region.

(5): In the photodetection element according the above-described aspect, the third region may contain Fe or a CoFe alloy, and a crystal structure of the third region may be a bcc structure.

(6): According to the second aspect, there is provided a receiver including the photodetection element according to the first aspect.

The photodetection element according to the above aspect has a high light detection ability.

DETAILED DESCRIPTION

Figure 1:
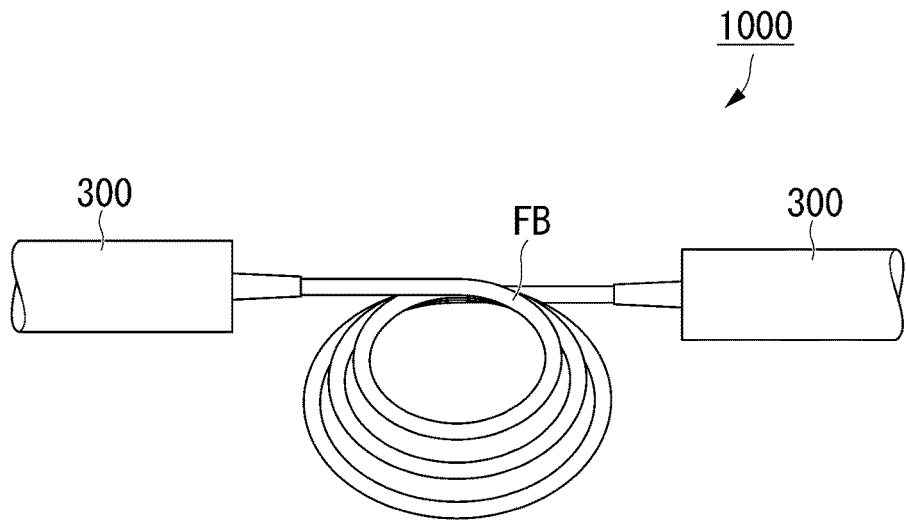
FIG. 1 is a conceptual diagram of a communication system according to a first embodiment.

Hereinafter, the present embodiment will be described in detail with reference to the drawings as appropriate. In the drawings used in the following description, featured parts may be enlarged parts for convenience so that the features of the present disclosure are easier to understand, and dimensional ratios and the like of the respective components may be different from actual ones. Materials, dimensions, and the like exemplified in the following description are examples, the present disclosure is not limited thereto, and modifications can be appropriately made in a range in which advantageous effects of the present disclosure are exhibited.

Directions will be defined. A lamination direction of a photodetection element 10 is defined as a z direction, one direction within a plane orthogonal to the z direction is an x direction, and a direction orthogonal to the x direction and the z direction is defined as a y direction. The z direction is an example of the lamination direction. Hereinafter, a +z direction may be expressed as an "upward" direction and a −z direction may be expressed as a "downward" direction. Hereinafter, the +z direction is a direction from a substrate Sb to the photodetection element 10. The upward and downward directions do not always coincide with a direction in which gravity is applied.

First Embodiment

FIG. 1 is a conceptual diagram of a communication system 1000 according to a first embodiment. The communication system 1000 shown in FIG. 1 includes a plurality of transceiver devices 300 and a fiber FB connected between the transceiver devices 300. The communication system 1000 can be used, for example, for short- and medium-distance communication within and between data centers, and long-distance communication between cities. The transceiver device 300 is installed in, for example, a data center. For example, the fiber FB is connected between data centers. The communication system 1000 performs communication between the transceiver device 300 via, for example, the fiber FB. The communication system 1000 may perform wireless communication between the transceiver device 300 without involving the fiber FB.

Figure 2:
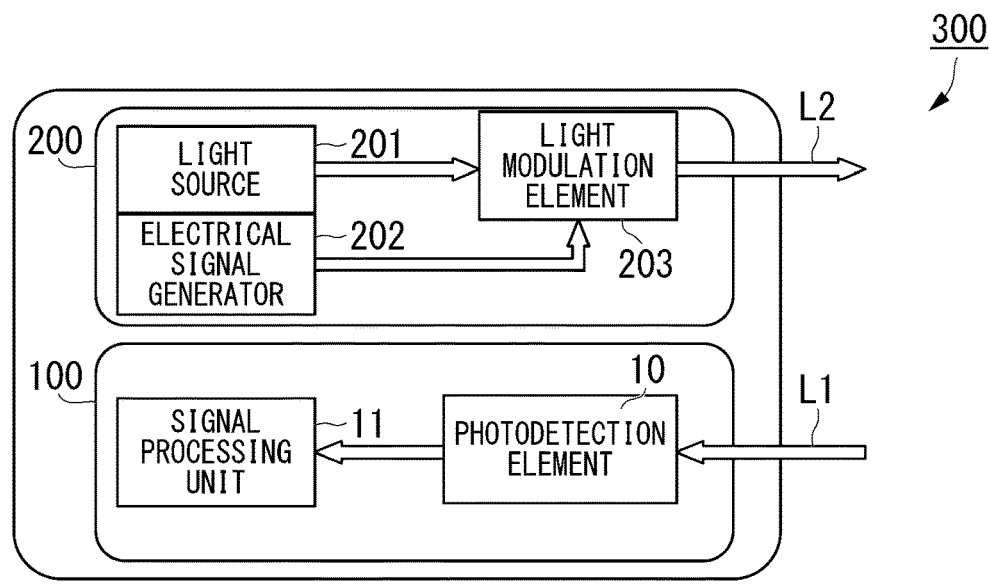
FIG. 2 is a block diagram of a transceiver device according to the first embodiment.

FIG. 2 is a block diagram of the transceiver device 300 according to the first embodiment. The transceiver device 300 includes a receiving device 100 and a transmission device 200. The receiving device 100 receives an optical signal L1 and the transmission device 200 transmits an optical signal L2. Light in the present specification is not limited to visible light and also includes infrared light having a longer wavelength than the visible light and ultraviolet light having a shorter wavelength than the visible light.

The receiving device 100 includes, for example, the photodetection element 10 and a signal processing unit 11. The photodetection element 10 converts the optical signal L1 into an electrical signal. Details of the photodetection element 10 will be described below. The signal processing unit 11 processes the electrical signal after the conversion by the photodetection element 10. The signal processing unit 11 receives the signal included in the optical signal L1 by processing the electrical signal generated from the photodetection element 10.

The transmission device 200 includes, for example, a light source 201, an electrical signal generation element 202, and an optical modulation element 203. The light source 201 is, for example, a laser element. The light source 201 may be outside the transmission device 200. The electrical signal generation element 202 generates an electrical signal on the basis of transmission information. The electrical signal generation element 202 may be integrated with a signal conversion element of the signal processing unit 11. The optical modulation element 203 modulates the light output from the light source 201 on the basis of the electrical signal generated by the electrical signal generation element 202 and outputs the optical signal L2.

Figure 3:
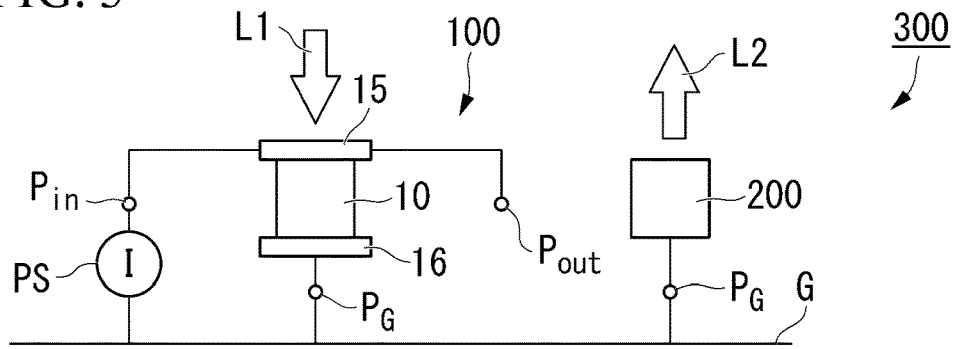
FIG. 3 is a circuit diagram of the transceiver device according to the first embodiment.

FIG. 3 is a circuit diagram of the transceiver device 300 according to the first embodiment. In FIG. 3, the signal processing unit 11 is omitted.

The receiving device 100 includes, for example, a photodetection element 10, a first electrode 15, a second electrode 16, an input terminal $P_{in}$, an output terminal $P_{out}$, and a reference potential terminal Pu. The first electrode 15 and the second electrode 16 sandwich the photodetection element 10 in the lamination direction. The first electrode 15 is, for example, an electrode on the side to which light including the optical signal L1 is applied. The wavelength of the light used for the optical signal L1 is, for example, 300 nm or more and 2 μm or less, and the light used for the optical signal L1 may be visible light or near-infrared light.

The first electrode 15 is connected to, for example, the input terminal $P_{in}$ and the output terminal $P_{out}$. The second electrode 16 is connected to, for example, the reference potential terminal $P_G$. The input terminal $P_{in}$ is connected to a power supply PS. The power supply PS may be outside the receiving device 100. The power supply PS applies a sense current, or the like to the photodetection element 10. When it is not necessary to cause an external current to flow through the photodetection element 10, the input terminal $P_{in}$ and the power supply PS may be omitted. The output terminal $P_{out}$ outputs a voltage between the first electrode 15 and the second electrode 16 sandwiching the photodetection element 10 in the lamination direction. A resistance value of the photodetection element 10 in the lamination direction is obtained from Ohm's law by causing a sense current to flow through the photodetection element 10 in the lamination direction. The output terminal $P_{out}$ is connected to the signal processing unit 11. The reference potential terminal Pu is connected to a reference potential and determines the reference potential of the receiving device 100. The reference potential in FIG. 3 is a potential of a ground G. The ground G may be provided outside the receiving device 100. The reference potential may be a potential other than the potential of the ground G.

The receiving device 100 and the transmission device 200 are connected to, for example, a common reference potential (the ground G). The reference potential may be different between the receiving device 100 and the transmission device 200. When the reference potentials of the receiving device 100 and the transmission device 200 are the same, the occurrence of noise can be reduced.

Figure 4:
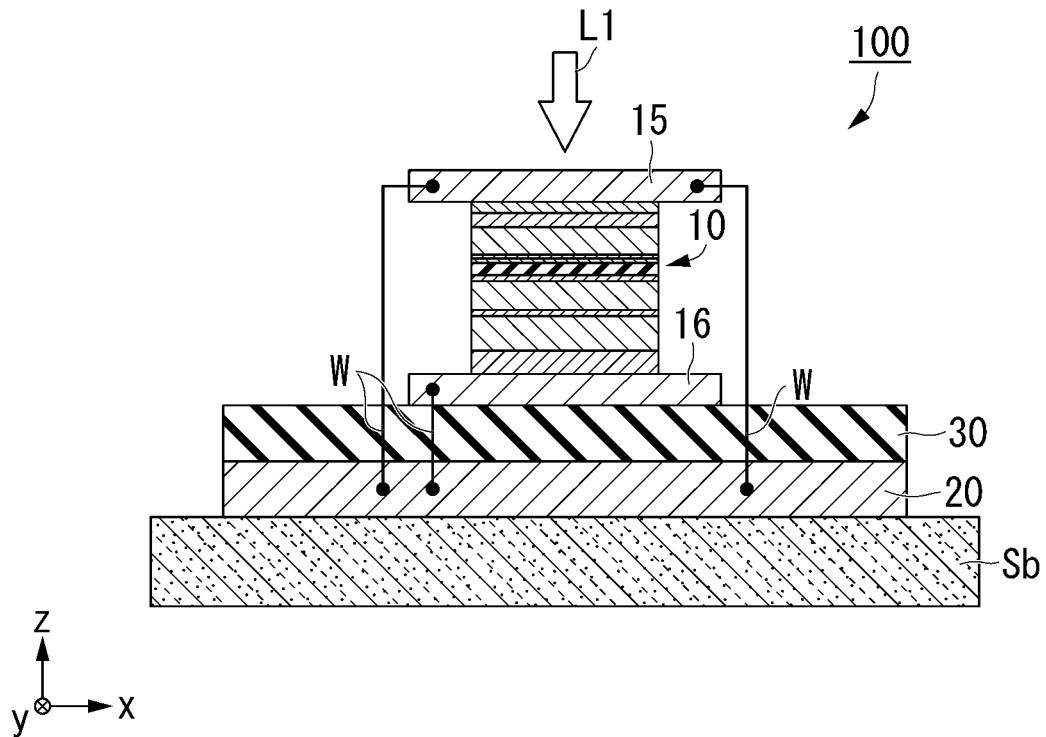
FIG. 4 is a cross-sectional view of a receiving device according to the first embodiment.

FIG. 4 is a cross-sectional view of the receiving device 100 according to the first embodiment. The receiving device 100 includes, for example, the photodetection element 10, an integrated circuit 20, and an interlayer insulating film 30. The photodetection element 10, the integrated circuit 20, and the interlayer insulating film 30 are formed on, for example, the same substrate Sb.

The integrated circuit 20 includes the signal processing unit 11 that processes a signal output from the photodetection element 10. In the integrated circuit 20, for example, the signal when the output voltage from the photodetection element 10 (the resistance value of the photodetection element 10 in the z direction) is greater than or equal to a threshold value is processed as a first signal (for example, "1") and the signal when the output voltage is less than the threshold value is processed as a second signal (for example, "0"). When the transmission device 200 is formed on the same substrate Sb, the integrated circuit 20 may include the light source 201, the electrical signal generation element 202, and the optical modulation element 203. The integrated circuit 20 and the photodetection element 10 are connected via, for example, through wiring w passing through the interlayer insulating film 30. These may be connected by wire bonding instead of the through wiring w.

The interlayer insulating film 30 is an insulator that insulates between wirings of multilayer wiring and between elements. The interlayer insulating film 30 is, for example, an oxide of Si, Al, or Mg, a nitride, or an oxynitride. The interlayer insulating film 30 is, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

Figure 5:
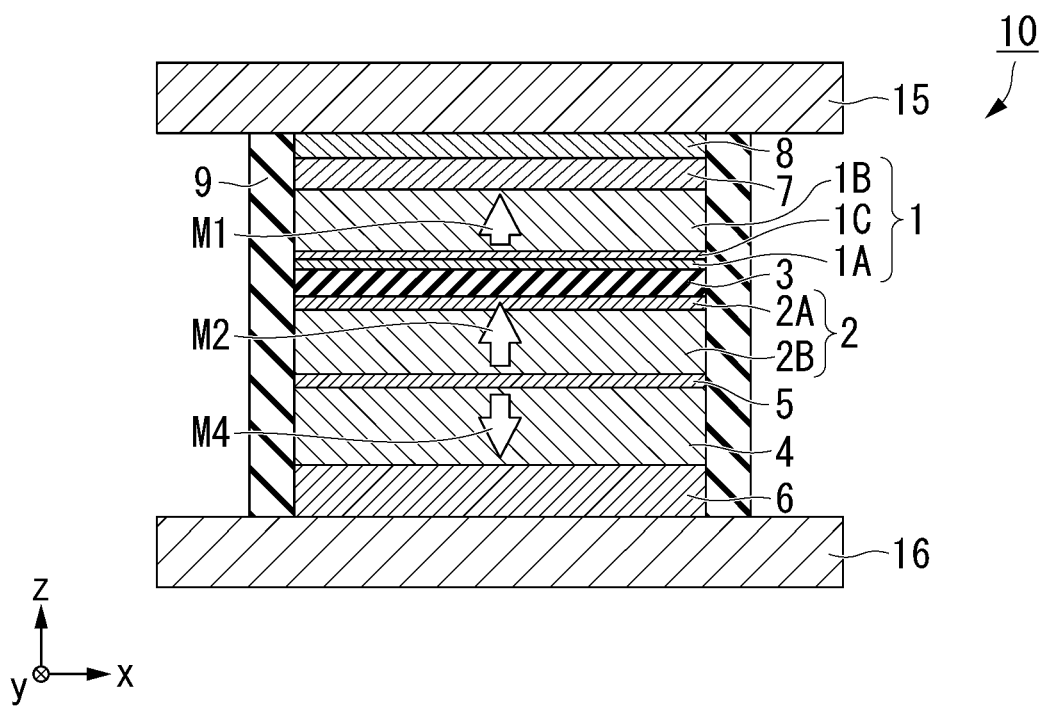
FIG. 5 is a cross-sectional view of a photodetection element according to the first embodiment.

FIG. 5 is a cross-sectional view of the photodetection element 10 according to the first embodiment. In FIG. 5, the first electrode 15 and the second electrode 16 are shown together and a direction of magnetization in an initial state of a ferromagnet is indicated by an arrow. In the present specification, ferromagnetism includes ferrimagnetism.

The photodetection element 10 includes at least a first ferromagnetic layer 1, a second ferromagnetic layer 2, and a spacer layer 3. The spacer layer 3 is positioned between the first ferromagnetic layer 1 and the second ferromagnetic layer 2. In addition to the above, the photodetection element 10 may have a third ferromagnetic layer 4, a magnetic coupling layer 5, a base layer 6, a perpendicular magnetization inducing layer 7, a cap layer 8, and a sidewall insulating layer 9.

The photodetection element 10 is, for example, a magnetic tunnel junction (MTJ) element in which the spacer layer 3 is made of an insulating material. In this case, the photodetection element 10 is an element in which a resistance value in the z direction (a resistance value when current flows in the z direction) changes in accordance with a change in a relative angle between the magnetization direction of the first ferromagnetic layer 1 and the magnetization direction of the second ferromagnetic layer 2. Such an element is also called a magnetoresistance effect element.

The first ferromagnetic layer 1 is a photodetection layer whose magnetization direction changes when light from the outside is applied to the first ferromagnetic layer 1. The first ferromagnetic layer 1 is also called a magnetization free layer. The magnetization free layer is a layer including a magnetic material whose magnetization direction changes when prescribed external force is applied. The prescribed external force is, for example, light applied from the outside, current flowing through the photodetection element 10 in the z direction, or an external magnetic field. Because a direction of the magnetization of a ferromagnet can vary with a high-speed change in the intensity of light applied to the ferromagnet (a high-frequency optical signal), the receiving device 100 can receive a high-frequency optical signal using the first ferromagnetic layer 1 as a photodetection layer and high-speed optical communication becomes possible.

The first ferromagnetic layer 1 includes, for example, the first region 1A, the second region 1B, and the intermediate layer 1C. The first region 1A is in contact with the spacer layer 3. The second region 1B is located at a position farther from the spacer layer 3 than the first region 1A. The intermediate layer 1C is between the first region 1A and the second region 1B. Each of the first region 1A and the second region 1B spreads in layers, for example, in the x direction and the y direction.

The first region 1A contains a ferromagnet. The first region 1A may have a higher boron concentration than the second region 1B, for example. The first region 1A is made of a CoFeB alloy. When the first region 1A in contact with the spacer layer 3 is a CoFeB alloy, the ratio of change in magnetic resistance (ratio of change in MR) of the photodetection element 10 becomes large. Therefore, if the first region 1A in contact with the spacer layer 3 is made of a CoFeB alloy, the output change of the photodetection element 10 with respect to the change in the magnetization state of the first region 1A becomes large.

The composition ratio of the CoFeB alloy can be changed as appropriate. The elemental ratio of the CoFeB alloy is, for example, Co:Fe:B=15 to 55:25 to 65:15 to 25 under the condition that the sum of Co, Fe, and B corresponds to 100.

The film thickness of the first region 1A is, for example, 5 Å or more and 20 Å or less It may be set to 8 Å or more and 15 Å or less, or 10 Å or less. Hereinafter, the film thickness of each layer and the film thickness of each region are taken as the average value of the thicknesses in the z direction at 10 different points in the xy plane.

The crystal structure of the CoFeB alloy constituting the first region 1A is, for example, a bcc structure.

The second region 1B is a magnetic material containing Fe and Gd as major constituent elements. The second region 1B is, for example, a laminated film in which a GdFe alloy, a GdFeCo alloy, Fe and Gd are laminated; or a laminated film in which a FeCo alloy and Gd are laminated. For example, as an example of the GdFe alloy or the GdFeCo alloy, there is Gd), $(Fe_{1-y}Co_y)_{1-x}$. Here, x is, for example, 0.2 or more and 0.3 or less, and y is, for example, 0 or more and 0.2 or less. Further, for example, there is $[Fe_{1-y}Co_y/Gd]$ as an example of the laminated film. Here, y is, for example, 0 or more and 0.2 or less, and z is the number of layers, which is 4 or more and 10 or less, for example. The thickness of each $Fe_{1-y}Co_y$ layer is, for example, 3.0 Å or more and 8.0 Å or less. The thickness of each Gd layer is, for example, 0.5 Å or more and 3.0 Å or less. The second region 1B may be a single alloy or may be a stack of multiple layers, each of which is composed of a single element. In the second region 1B, the total mole fraction of Fe and Gd among the constituent elements is, for example, 70% or more.

The second region 1B is, for example, a perpendicularly magnetized film having an easy magnetization axis in the direction perpendicular to the film surface (z direction). The film thickness of the second region 1B is, for example, 10 Å or more and 200 Å or less. The thickness of the second region 1B may be thicker than that of the first region 1A.

The crystal structure of the magnetic material containing Fe and Gd constituting the second region 1B is, for example, a bcc structure.

The intermediate layer 1C contains one or more elements selected from the group consisting of Mo, Ru, Ta, W, and Pt. The intermediate layer 1C is a non-magnetic layer. The intermediate layer 1C is made of, for example, Mo, Ru, Ta, W, or Pt. The first region 1A and the second region 1B are magnetically coupled with the intermediate layer 1C interposed therebetween. The film thickness of the intermediate layer 1C is, for example, 10 Å or less; or 1 Å or more and 10 Å or less.

The total film thickness of the first ferromagnetic layer 1 is, for example, 1 nm or more and 10 nm or less. The film thickness of the first ferromagnetic layer 1 may be 1 nm or more and 5 nm or less, for example. When the film thickness of the first ferromagnetic layer 1 is thin, the perpendicular magnetic anisotropy of the first ferromagnetic layer 1 increases effectively. By providing the first region 1A in the first ferromagnetic layer 1, the MR ratio of the photodetection element 10 is improved even when the first ferromagnetic layer 1 is thin, and the ratio of output change of the photodetection element 10 with respect to the change in the magnetization state of the first ferromagnetic layer 1 is improved.

When the first ferromagnetic layer 1 has the intermediate layer 1C, the influence of the crystal structures of the first region 1A and the second region 1B being different can be mitigated. By alleviating the difference in crystal structure between the first region 1A and the second region 1B with the intermediate layer 1C, the crystallinity of the second region 1B formed on the intermediate layer 1C is improved.

In the second region 1B, it is considered that the magnetic moment of the Fe atom and the magnetic moment of the Gd atom are ferrimagnetically coupled. The state of the magnetic moment of the Gd atom tends to change with light irradiation. Therefore, it is more likely that the magnetization of the second region 1B changes with light irradiation than the magnetization of the first region 1A in the case where the second region 1B does not exist in the first ferromagnetic layer 1. When the magnetization state of the second region 1B changes, the magnetization state of the first region 1A that magnetically couples with the second region 1B across the intermediate layer 1C also changes.

The second ferromagnetic layer 2 is a magnetization fixed layer. The magnetization fixed layer is a layer made of a magnetic material whose magnetization direction is less likely to change than that of the magnetization free layer when prescribed external force has been applied. For example, coercivity of the second ferromagnetic layer 2 is greater than that of the first ferromagnetic layer 1. The second ferromagnetic layer 2 has an axis of easy magnetization in the same direction as the first ferromagnetic layer 1. The second ferromagnetic layer 2 may be either an in-plane magnetization film or a perpendicular magnetization film.

The second ferromagnetic layer 2 has the third region 2A and the fourth region 2B. The third region 2A is in contact with the spacer layer 3. The fourth region 2B is located at a position farther from the spacer layer 3 than the third region 2A. Each of the third region 2A and the fourth region 2B spreads in layers, for example, in the x direction and the y direction.

The third region 2A contains a ferromagnet. The third region 2A may not contain boron or may have a lower boron concentration than the fourth region 2B, for example. The third region 2A contains, for example, a Fe or a CoFe alloy. The third region 2A may be made of Fe or a CoFe alloy. The crystal structure of the third region 2A may be, for example, a bcc structure. The film thickness of the third region 2A is, for example, 5 Å or more and 10 Å or less. When the second ferromagnetic layer 2 has the third region 2A, the MR ratio of the photodetector 10 is improved.

The fourth region 2B contains a ferromagnet. The fourth region 2B may be a single alloy or may be a stack of multiple layers, each of which is composed of a single element. The fourth region 2B may have a higher boron concentration than the third region 2A, for example. The fourth region 2B contains, for example, a CoFeB alloy. The fourth region 2B may have a non-magnetic insertion layer made of, for example, W and Ta in the fourth region 2B. The fourth region 2B may have, for example, a Co or CoFe alloy; a laminated film of Co and Pt; an insertion layer made of Mo and Ta; and a CoFeB alloy, in order from the side farther from the spacer layer 3. The film thickness of the fourth region 2B is, for example, 30 Å or more and 100 Å or less. It may be 50 Å or more and 70 Å or less.

The magnetization of the second ferromagnetic layer 2 may be fixed by, for example, magnetic coupling to the third ferromagnetic layer 4 via the magnetic coupling layer 5. In this case, a combination of the second ferromagnetic layer 2, the magnetic coupling layer 5, and the third ferromagnetic layer 4 may be called a magnetization fixed layer.

The third ferromagnetic layer 4 is magnetically coupled to, for example, the second ferromagnetic layer 2. The magnetic coupling is, for example, antiferromagnetic coupling and is caused by Ruderman-Kittel-Kasuya-Yosida (RKKY) interaction. The material constituting the third ferromagnetic layer 4 is, for example, similar to that of the first ferromagnetic layer 1. The third ferromagnetic layer 4 is, for example, a laminated film in which Co and Pt are alternately laminated, and a laminated film in which Co and Ni are alternately laminated. The magnetic coupling layer 5 is, for example, Ru, Ir, or the like. A thickness of the magnetic coupling layer 5 is, for example, a thickness at which the second ferromagnetic layer 2 and the third ferromagnetic layer 4 are antiferromagnetically coupled by the RKKY interaction.

The spacer layer 3 is a nonmagnetic layer arranged between the first ferromagnetic layer 1 and the second ferromagnetic layer 2. The spacer layer 3 includes a layer made of a conductor, an insulator, or a semiconductor or a layer including a current carrying point formed of a conductor within an insulator. A thickness of the spacer layer 3 can be adjusted in accordance with orientation directions of the magnetization M1 of the first ferromagnetic layer 1 and the magnetization M2 of the second ferromagnetic layer 2 in an initial state to be described below.

For example, when the spacer layer 3 is made of an insulator, the photodetection element 10 has a magnetic tunnel junction (MTJ) including the first ferromagnetic layer 1, the spacer layer 3, and the second ferromagnetic layer 2. Such an element is called an MTJ element. In this case, the photodetection element 10 can exhibit a tunnel magnetoresistance (TMR) effect. For example, when the spacer layer 3 is made of a metal, the photodetection element 10 can exhibit a giant magnetoresistance (GMR) effect. Such an element is called a GMR element. The photodetection element 10 may be called the MTJ element, the GMR element, or the like, which differs according to the constituent material of the spacer layer 3, but they may also be collectively called magnetoresistance effect elements.

When the spacer layer 3 is made of an insulating material, materials of aluminum oxide, magnesium oxide, titanium oxide, silicon oxide, and the like can be used. A high magnetoresistance change rate can be obtained by adjusting the thickness of the spacer layer 3 so that a strong TMR effect is exhibited between the first ferromagnetic layer 1 and the second ferromagnetic layer 2. In order to use the TMR effect efficiently, the thickness of the spacer layer 3 may be about 0.5 to 10.0 nm.

When the spacer layer 3 is made of a nonmagnetic conductive material, a conductive material such as Cu, Ag, Au, or Ru can be used. In order to use the GMR effect efficiently, the thickness of the spacer layer 3 may be about 0.5 to 3.0 nm.

When the spacer layer 3 is made of a nonmagnetic semiconductor material, a material such as zinc oxide, indium oxide, tin oxide, germanium oxide, gallium oxide, or indium tin oxide (ITO) can be used. In this case, the thickness of the spacer layer 3 may be about 1.0 to 4.0 nm.

When a layer including a current carrying point made of a conductor within a nonmagnetic insulator is applied as the spacer layer 3, a structure may be formed to include a current carrying point made of a conductor of CoFe, CoFeB, CoFeSi, CoMnGe, CoMnSi, CoMnAl, Fe, Co, Au, Cu, Al, Mg, or the like within the nonmagnetic insulator made of aluminum oxide or magnesium oxide. In this case, a thickness of the spacer layer 3 may be about 1.0 to 2.0 nm. The current carrying point is, for example, a columnar body having a diameter of 1 nm or more and 5 nm or less.

A base layer 6 shown in FIG. 5 is, for example, on the second electrode 16. The base layer 6 is a seed layer or a buffer layer. The seed layer enhances the crystallinity of the layer laminated on the seed layer. The seed layer is, for example, Pt, Ru, Hf, Zr, or NiFeCr. A thickness of the seed layer is, for example, 1 nm or more and 5 nm or less. The buffer layer is a layer that alleviates lattice mismatch between different crystals. The buffer layer is, for example, Ta, Ti, W, Zr, Hf, or a nitride of these elements. A thickness of the buffer layer is, for example, 1 nm or more and 5 nm or less.

The cap layer 8 is disposed between the first ferromagnetic layer 1 and the first electrode 15 (between the second region 1B and the first electrode 15). The cap layer 8 may include the perpendicular magnetization inducing layer 7 laminated on the first ferromagnetic layer 1 and in contact with the first ferromagnetic layer 1. The perpendicular magnetization inducing layer 7 induces perpendicular magnetic anisotropy of the first ferromagnetic layer 1. The perpendicular magnetization inducing layer 7 is, for example, magnesium oxide, W, Ta, Mo, or the like. When the perpendicular magnetization inducing layer 7 is magnesium oxide, magnesium oxide may be oxygen-deficient to increase conductivity. A thickness of the perpendicular magnetization inducing layer 7 is, for example, 0.5 nm or more and 5.0 nm or less. As an example, the second region 1B of the first ferromagnetic layer 1 is disposed between the Mo layer and the intermediate layer 1C. The Mo layer is a part of the cap layer 8 and is in contact with the second region 1B. In this case, the thickness of the intermediate layer 1C may be thinner than the thickness of the Mo layer which is a part of the cap layer 8 and is in contact with the second region 1B.

The cap layer 8 prevents damage to a lower layer during the process and enhances the crystallinity of the lower layer during annealing. A thickness of the cap layer 8 is, for example, 10 nm or less so that the first ferromagnetic layer 1 is irradiated with sufficient light.

The sidewall insulating layer 9 covers the periphery of the laminate including the first ferromagnetic layer 1 and the second ferromagnetic layer 2. The sidewall insulating layer 9 is made of, for example, a material similar to that of the interlayer insulating film 30.

The first electrode 15 has, for example, transparency to light in the wavelength range used for the optical signal L1. The wavelength range of light used for the optical signal L1 is, for example, 300 nm or more and 2 μm or less, and includes a visible light range and a near-infrared light range. The first electrode 15 is a transparent electrode made of indium tin oxide (ITO), indium zinc oxide (IZO), zinc oxide (ZnO), indium gallium zinc oxide (IGZO), or the like. The first electrode 15 may be configured to have multiple columnar metals among the transparent electrode materials. Also, the first electrode 15 may have an antireflection film on an irradiation surface irradiated with light.

The second electrode 16 is made of a conductive material. The second electrode 16 is a laminated film of Ta, Ru and Ta; a laminated film of Ta, Cu and Ta; a laminated film of Ta, Cu and Ti; or a laminated film of Ta, Cu and TaN.

The photodetection element 10 is manufactured in a laminating process, an annealing process, and a processing process of each layer. First, layers are laminated in the order of the base layer 6, the third ferromagnetic layer 4, the magnetic coupling layer 5, the second ferromagnetic layer 2, the spacer layer 3, the first ferromagnetic layer 1, the perpendicular magnetization inducing layer 7, and the cap layer 8 on the second electrode 16. Each layer is formed by, for example, sputtering.

Subsequently, the laminated film is annealed. An annealing temperature is, for example, 250° C. or more and 450° C. or less. Subsequently, the laminated film is processed into a prescribed columnar body by photolithography and etching. The columnar body may be a cylindrical body or a prismatic body. For example, the shortest width when the columnar body is viewed from the z direction may be 10 nm or more and 1000 nm or less.

Subsequently, an insulating layer is formed to cover the side surface of the columnar body. The insulating layer is the sidewall insulating layer 9. The sidewall insulating layer 9 may be laminated a plurality of times. Subsequently, the upper surface of the cap layer 8 is exposed from the sidewall insulating layer 9 by chemical mechanical polishing, and the first electrode 15 is produced on the cap layer 8. In the above-described process, the photodetection element 10 is obtained.

Next, an example of an operation of the photodetection element 10 according to the first embodiment will be described. The first ferromagnetic layer 1 is irradiated with light including the optical signal L1 having a change in an intensity of light. The output voltage of the photodetection element 10 from the z direction changes by irradiating the first ferromagnetic layer 1 with light including the optical signal L1. The case where intensities of the light applied to the first ferromagnetic layer 1 are two levels of the first intensity and the second intensity will be described as an example. The light intensity in the second intensity is set to be greater than the light intensity in the first intensity. The first intensity may correspond to the case where the intensity of the light applied to the first ferromagnetic layer 1 is zero.

Figure 6:
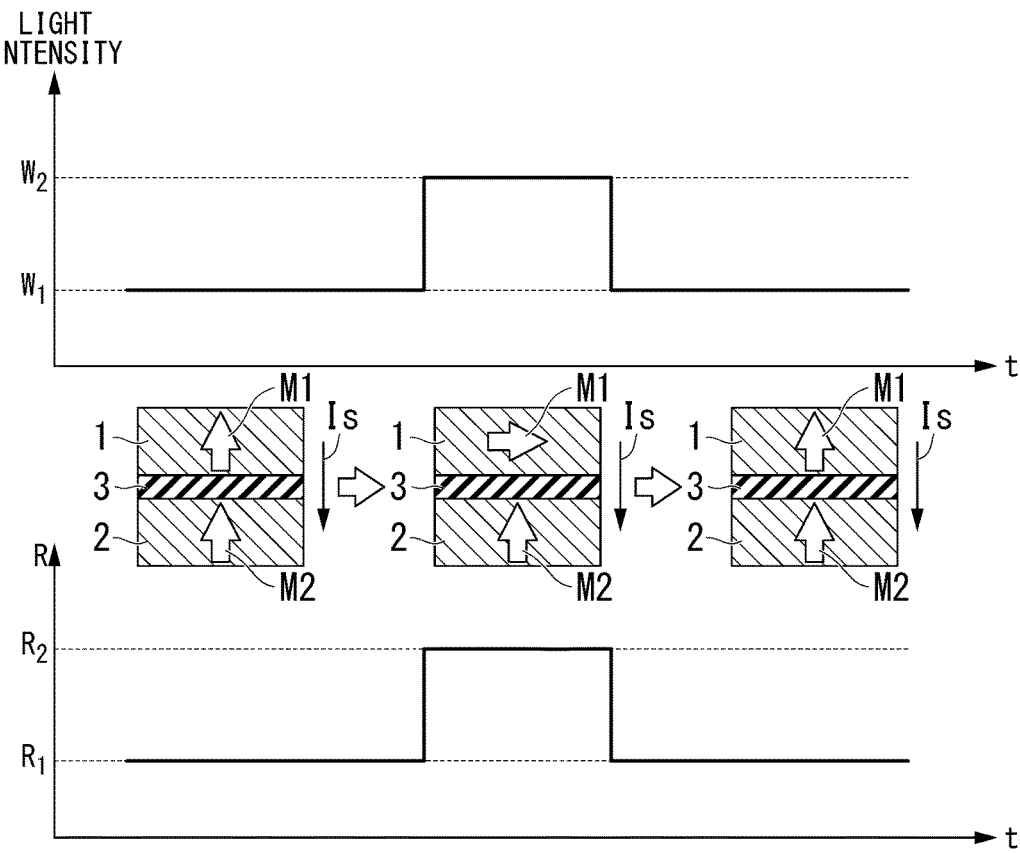
FIG. 6 is a schematic diagram for describing an operation of the photodetection element according to the first embodiment in a first mechanism.
Figure 7:
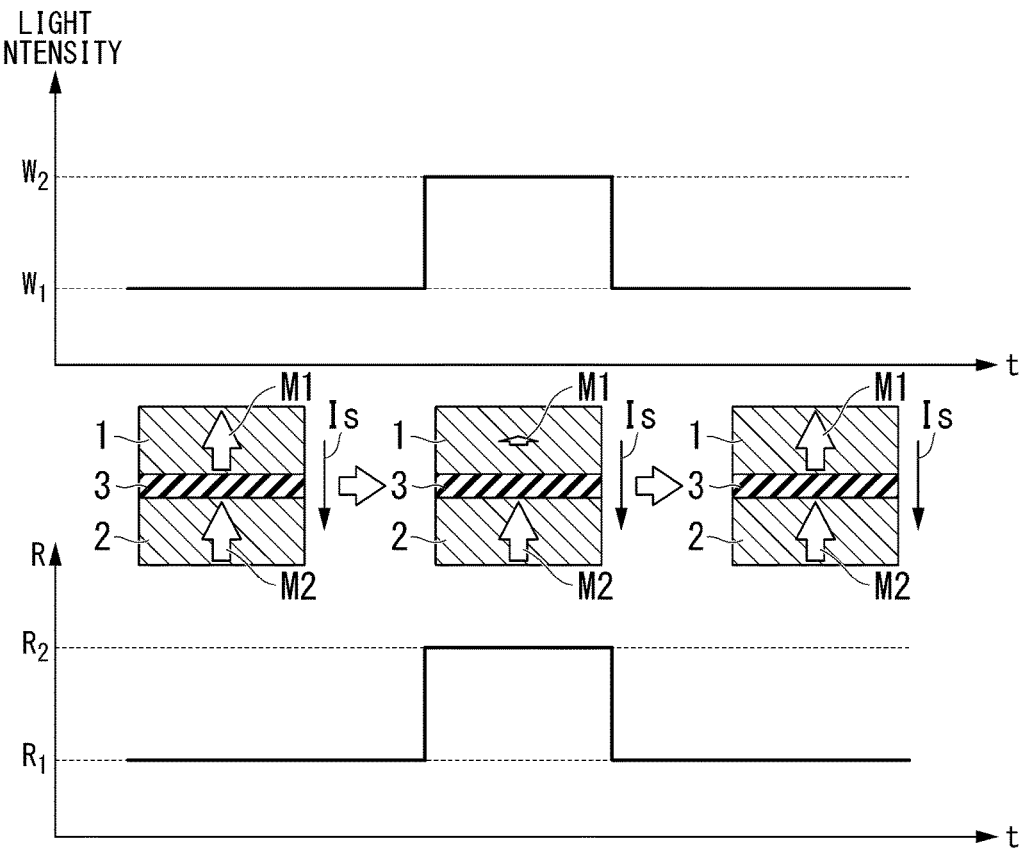
FIG. 7 is a schematic diagram for describing the operation of the photodetection element according to the first embodiment in a second mechanism.

FIGS. 6 and 7 are diagrams for describing an example of the operation of the photodetection element 10 according to the first embodiment. Two mechanisms are considered as the operating mechanism of the photodetection element 10, FIG. 6 is a diagram for describing the first mechanism, and FIG. 7 is a diagram for describing the second mechanism. In the upper graphs of FIGS. 6 and 7, the vertical axis represents an intensity of light applied to the first ferromagnetic layer 1 and the horizontal axis represents time. In the lower graphs of FIGS. 6 and 7, the vertical axis represents a resistance value of the photodetection element 10 in the z direction and the horizontal axis represents time.

First, in a state in which the first ferromagnetic layer 1 is irradiated with light of the first intensity (hereinafter called an initial state), there is a relationship in which the magnetization M1 of the first ferromagnetic layer 1 is parallel to the magnetization M2 of the second ferromagnetic layer 2, a resistance value of the photodetection element 10 in the z direction is a first resistance value $R_1$, and a magnitude of the output voltage from the photodetection element 10 has a first value. The resistance value of the photodetection element 10 in the z direction is obtained by causing a sense current Is to flow through the photodetection element 10 in the z direction to generate a voltage across both ends of the photodetection element 10 in the z direction and using Ohm's law from a voltage value. The output voltage from the photodetection element 10 is generated between the first electrode 15 and the second electrode 16. In the case of the example shown in FIG. 6, the sense current Is flows in a direction from the first ferromagnetic layer 1 to the second ferromagnetic layer 2. By causing the sense current Is to flow in the above direction, a spin transfer torque in a direction, which is the same as that of the magnetization M2 of the second ferromagnetic layer 2, acts on the magnetization M1 of the first ferromagnetic layer 1 and the magnetization M1 becomes parallel to the magnetization M2 in the initial state. Also, by causing the sense current Is to flow in the above direction, it is possible to prevent the magnetization M1 of the first ferromagnetic layer 1 from being inverted during operation.

Next, the intensity of the light applied to the first ferromagnetic layer 1 changes from the first intensity to the second intensity. The second intensity is greater than the first intensity and the magnetization M1 of the first ferromagnetic layer 1 changes from the initial state. The state of the magnetization M1 is, for example, a tilt angle with respect to the z direction, a magnitude, or the like. For example, as shown in FIG. 6, when the intensity of the light applied to the first ferromagnetic layer 1 changes from the first intensity to the second intensity, the magnetization M1 is tilted in the z direction. An angle between the direction of the magnetization M1 of the first ferromagnetic layer 1 in a state in which light including the optical signal L1 is not applied to the first ferromagnetic layer 1 and the magnetization direction of the first ferromagnetic layer 1 at the second intensity is greater than 0° and less than 90°. Also, for example, as shown in FIG. 7, when the intensity of the light applied to the first ferromagnetic layer 1 changes from the first intensity to the second intensity, the magnitude of the magnetization M1 becomes small. When the magnetization M1 of the first ferromagnetic layer 1 changes from the initial state, the resistance value of the photodetection element 10 in the z direction is a second resistance value $R_2$ and the magnitude of the output voltage from the photodetection element 10 has a second value. The second resistance value $R_2$ is larger than the first resistance value $R_1$. The second resistance value $R_2$ is between a resistance value when the magnetization M1 is parallel to the magnetization M2 (the first resistance value $R_1$) and a resistance value when the magnetization M1 is antiparallel to the magnetization M2.

A spin transfer torque in a direction, which is the same as that of the magnetization M2 of the second ferromagnetic layer 2, acts on the magnetization M1 of the first ferromagnetic layer 1. Therefore, in the case shown in FIG. 6, the magnetization M1 tilted from the initial state tries to return to a state in which the magnetization M1 is parallel to the magnetization M2 and the photodetection element 10 returns to the initial state when the intensity of the light applied to the first ferromagnetic layer 1 changes from the second intensity to the first intensity. In the case shown in FIG. 7, when the intensity of the light applied to the first ferromagnetic layer 1 returns to the first intensity, the magnitude of the magnetization M1 of the first ferromagnetic layer 1 returns to the original magnitude and the photodetection element 10 returns to the initial state. In any case, when the magnetization M1 returns to the initial state, the resistance value of the photodetection element 10 in the z direction returns to the first resistance value $R_1$. That is, when the intensity of the light applied to the first ferromagnetic layer 1 changes from the second intensity to the first intensity, the resistance value of the photodetection element 10 in the z direction changes from the second resistance value $R_2$ to the first resistance value $R_1$.

In any mechanism, the resistance value of the photodetection element 10 in the lamination direction changes in correspondence with the change in the intensity of the light applied to the first ferromagnetic layer 1. As a result, the change in the intensity of the optical signal L1 can be converted into the change in the resistance value of the photodetector 10 in the z direction. Further, the output voltage from the photodetection element 10 changes in correspondence with the change in the intensity of the light applied to the first ferromagnetic layer 1. As a result, the change in the intensity of the optical signal L1 can be converted into the change in the output voltage from the photodetection element 10. The output from the photodetection element 10 is sent to the signal processing unit 11. When the output is equal to or greater than the threshold value, it is processed as the first signal (for example, "1").

If the output is less than the threshold value, it is processed as a second signal (for example, "0").

The case where the light applied to the first ferromagnetic layer 1 has two stages of the first intensity and the second intensity has been described as an example above. However, unlike these descriptions, the photodetection element 10 according to the first embodiment can also read multi-valued information from the optical signal L1 by increasing the intensity of the light applied to the first ferromagnetic layer 1 in more than two steps.

Figure 8:
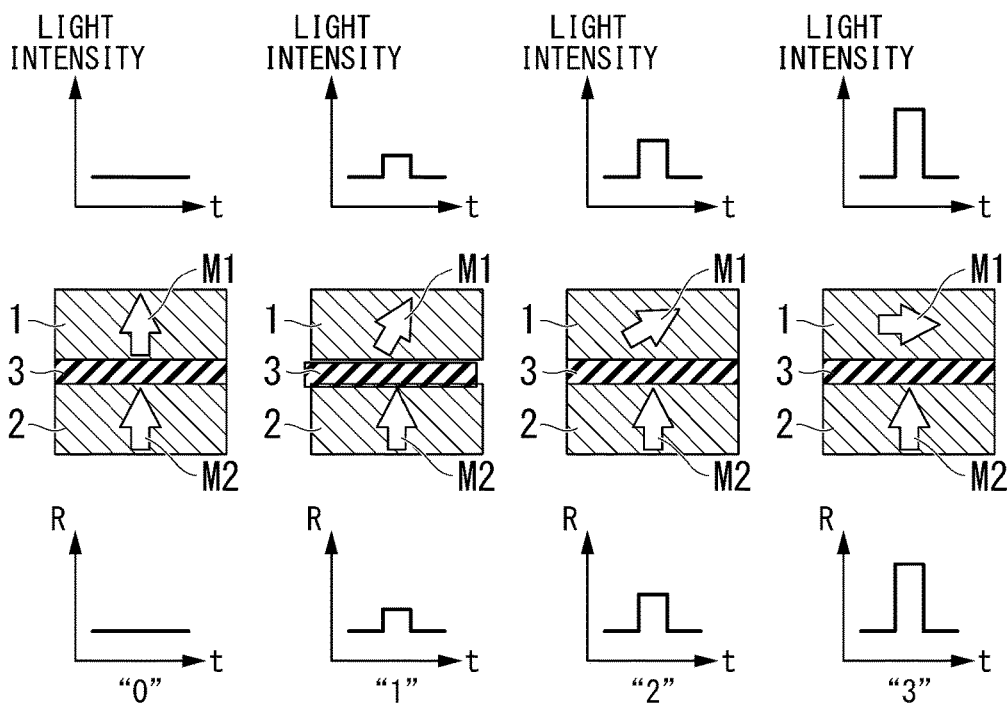
FIG. 8 is a schematic diagram for describing an operation of the first mechanism of the photodetection element when multiple values are output using the photodetection element according to the first embodiment.
Figure 9:
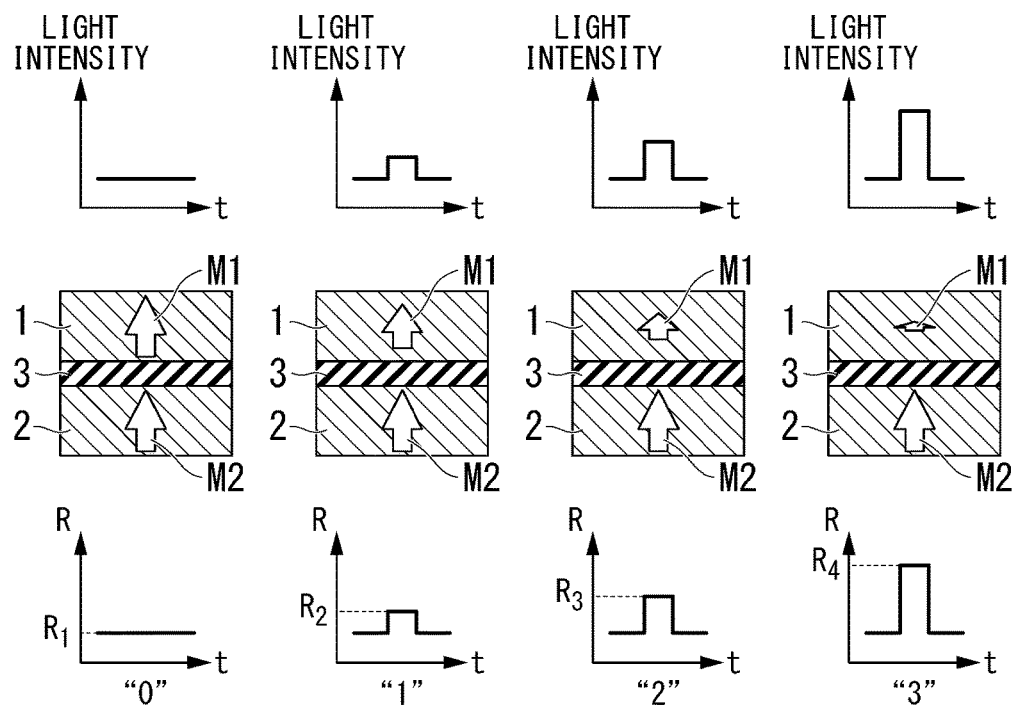
FIG. 9 is a schematic diagram for describing an operation of the second mechanism of the photodetection element when multiple values are output using the photodetection element according to the first embodiment.

FIGS. 8 and 9 show the behavior of the photodetection element 10 when the photodetection element 10 according to the first embodiment is used to output multiple values. FIG. 8 is a diagram for describing the first mechanism and FIG. 9 is a diagram for describing the second mechanism. FIGS. 8 and 9 show the magnetization state of the photodetection element 10 and the resistance value in the z direction at each of a first intensity, a second intensity, a third intensity, and a fourth intensity in order from the left. The intensity of the light applied to the first ferromagnetic layer 1 is higher in the order of the fourth intensity, the third intensity, the second intensity, and the first intensity.

As shown in FIG. 8, when the magnetization M1 is tilted in accordance with the intensity of the applied light, a change in the angle of the magnetization M1 from the initial state increases as the intensity of the light applied to the first ferromagnetic layer 1 increases. Each of angular changes of the second intensity, the third intensity, and the fourth intensity with respect to the direction of the magnetization M1 of the first ferromagnetic layer 1 not irradiated with the light with the optical signal L1, is more than 0° and less than 90°. A change in the resistance value of the photodetection element 10 in the z direction with respect to the initial state increases as the change in the angle of the magnetization M1 from the initial state increases. Therefore, the resistance value of the photodetection element 10 in the z direction differs according to each of the first intensity, the second intensity, the third intensity, and the fourth intensity. For example, the photodetection element 10 according to the first embodiment can read information of four values of "0," "1," "2," and "3" by separately defining a threshold value of the output voltage (a threshold value of the resistance value) at a plurality of levels. Although the case where four values are read is shown as an example here, the number of values to be read can be freely designed by setting the threshold value of the output voltage (the threshold value of the resistance value).

Likewise, in the case of FIG. 9, when the intensity of the light applied to the first ferromagnetic layer 1 increases, the magnitude of the magnetization M1 of the first ferromagnetic layer 1 also decreases from the initial state due to the external energy generated by the irradiation of the light. When the magnetization M1 of the first ferromagnetic layer 1 decreases from the initial state, the resistance value of the photodetection element 10 in the z direction changes. For example, the resistance value of the photodetection element 10 in the z direction changes to a second resistance value $R_2$, a third resistance value $R_3$, or a fourth resistance value $R_4$ in accordance with a magnitude of the magnetization M1 of the first ferromagnetic layer 1. Therefore, as in the case of FIG. 8, the difference in the output voltage from the photodetection element 10 can be output as multi-valued or analog data.

As described above, the photodetection element 10 according to the first embodiment converts the optical signal into an electrical signal.

In the photodetection element 10, since the first region 1A in contact with the spacer layer 3 is a CoFeB alloy, the ratio of change in magnetic resistance (ratio of change in MR) is large. Therefore, in the photodetection element 10, the output change of the photodetection element 10 is large with respect to the change in the magnetization state of the first region 1A.

Further, since the photodetection element 10 has the second region 1B which is a magnetic material containing Fe and Gd, the state of magnetization of the second region 1B changes even when irradiated with a small amount of light, and magnetically couples with the second region 1B. The state of magnetization of the first region 1A also changes.

Therefore, the output of the photodetection element 10 changes significantly with respect to the change in the amount of applied light. As described above, the photodetection element 10 according to the first embodiment has high conversion efficiency of an optical signal into an electrical signal and high optical detection ability.

Further, in the first embodiment, the MR ratio of the photodetection element 10 is improved by having the first ferromagnetic layer 1 with the first region 1A. Further, when the second ferromagnetic layer 2 has the third region 2A, the MR ratio of the photodetector 10 is improved. There is a desire to reduce the thickness of the first ferromagnetic layer 1 in order to enhance the response characteristics of the photodetection element 10 to light. However, when the photodetection element 10 has the first region 1A and the third region 2A, even within these restrictions, the MR ratio of the photodetection element 10 can be increased. As a result, the amount of change in the resistance value of the photodetection element 10 (the amount of change in the voltage output from the photodetection element 10) with respect to the change in the light intensity of the optical signal L1 can be increased. As a result, the sensitivity of the photodetection element 10 can be increased, and the photodetection element 10 can be used for the receiving device 100 that enables high-speed communication.

Although examples in which the transceiver device is applied to the communication system 1000 shown in FIG. 1 have been described above, the communication system is not limited to the cases thereof.

Figure 10:
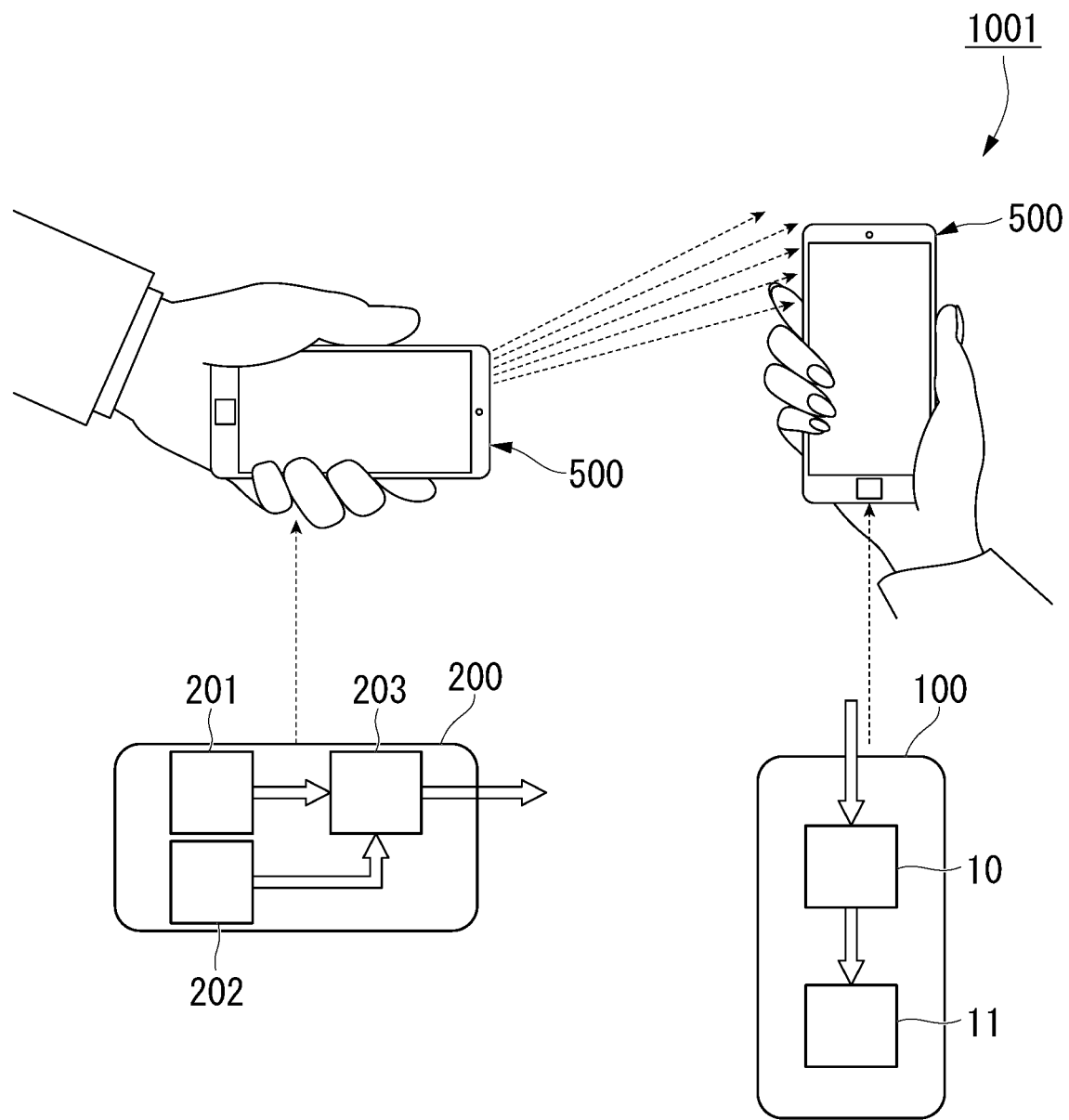
FIG. 10 is a conceptual diagram of another example of the communication system.

For example, FIG. 10 is a conceptual diagram of another example of the communication system. In a communication system 1001 shown in FIG. 10, communication is performed between two portable terminal devices 500. The portable terminal device 500 is, for example, a smartphone, a tablet, or the like.

Each of the portable terminal devices 500 includes a receiving device 100 and a transmission device 200. An optical signal transmitted from the transmission device 200 of one portable terminal device 500 is received by the receiving device 100 of the other portable terminal device 500. Light used for transmission/reception between the portable terminal devices 500 is, for example, visible light. As a photodetection element 10 of each receiving device 100, one of the above-described photodetection elements may be applied.

Figure 11:
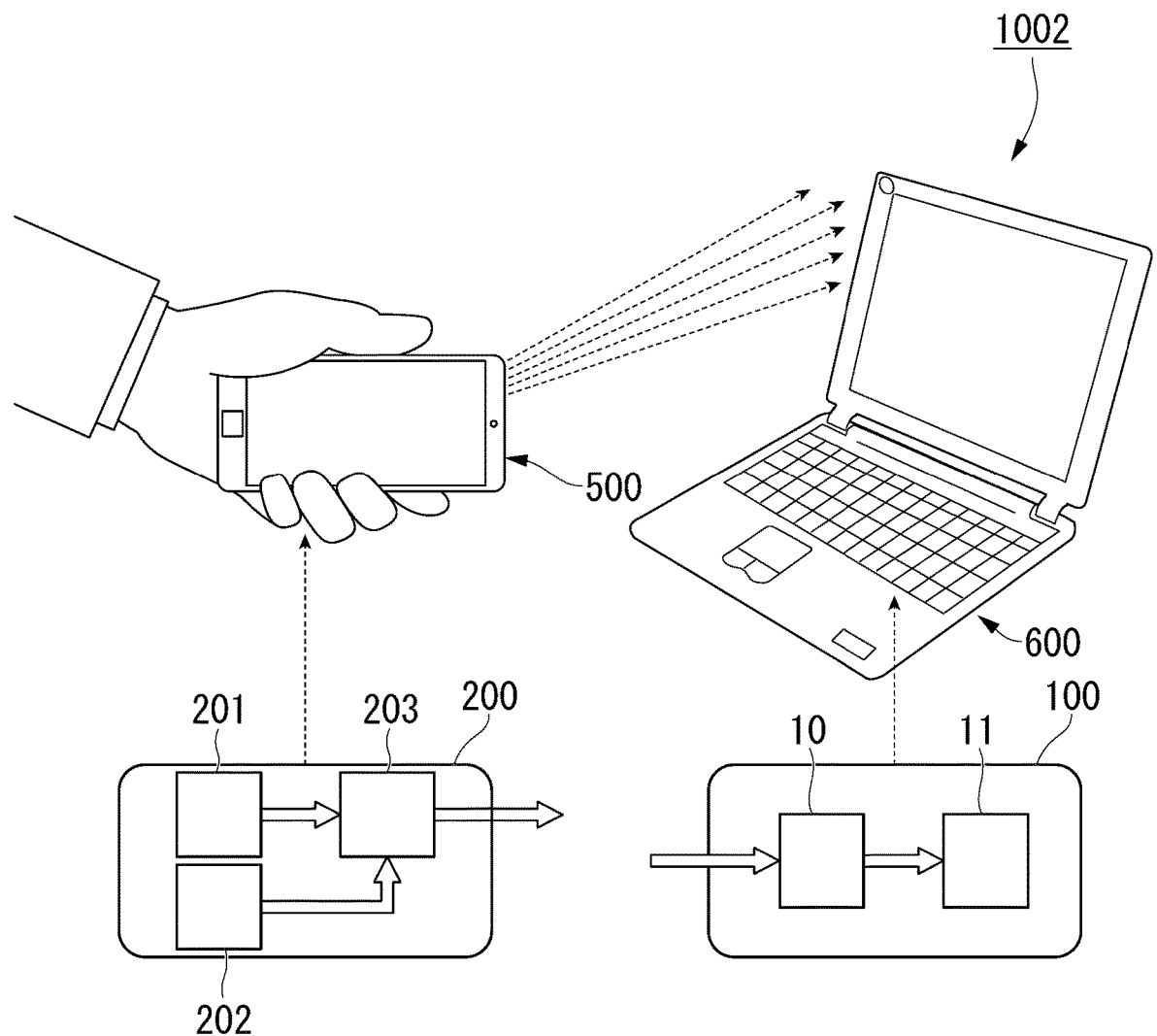
FIG. 11 is a conceptual diagram of another example of the communication system.

Also, for example, FIG. 11 is a conceptual diagram of another example of the communication system. In a communication system 1002 shown in FIG. 11, communication is performed between a portable terminal device 500 and an information processing device 600. The information processing device 600 is, for example, a personal computer.

The portable terminal device 500 includes a transmission device 200 and the information processing device 600 includes a receiving device 100. An optical signal transmitted from the transmission device 200 of the portable terminal device 500 is received by the receiving device 100 of the information processing device 600. Light used for transmission/reception between the portable terminal device 500 and the information processing device 600 is, for example, visible light. As a photodetection element 10 of each receiving device 100, one of the above-described photodetection elements may be applied.

The present disclosure is not limited to the above-described embodiments and modified examples and various modifications and changes can be made within the scope of the subject matter of the present disclosure described within the scope of the claims.

Here, the case where the photodetection element is used for the receiving device is illustrated, but the case is not limited to this case. For example, the photodetection element according to the present disclosure can be used for various semiconductor photodetection elements such as image sensors.

EXAMPLE

Example 1

A second electrode, a base layer, and a second ferromagnetic layer were formed on the substrate in this order using targets of each material. The second electrode was set to Ta with a thickness of 50 Å, Ru with a thickness of 600 Å, and Ta with a thickness of 100 Å in this order from the substrate side. The base layer was Ta with a thickness of 20 Å and Pt with a thickness of 20 Å in this order from the substrate side. The second ferromagnetic layer was made of: a laminated film in which Co with a thickness of 5 Å and Pt with a thickness of 4 Å were alternately laminated four times; Co with a thickness of 6 Å; Ru with a thickness of 8 Å; Co with a thickness of 6 Å; a laminated film in which Pt with a thickness of 4 Å and Co with a thickness of 5 Å were alternatively laminated three times; Mo with a thickness of 4 Å; CoFeB with a thickness of 6 Å; and Fe with a thickness of 5 Å, in order from the substrate side.

Next, after forming a Mg film, an oxidation treatment was performed in an oxidation chamber to prepare a spacer layer of MgO with a thickness of 12 Å. Next, co-sputtering (binary simultaneous sputtering) using a target of $CO_{0.65}B_{0.35}$ and a target of $Fe_{0.65}B_{0.35}$ was performed on the spacer layer, and the first region of the first ferromagnetic layer was formed in a thickness of 10 Å. Next, Mo with a thickness of 5 Å was formed as an intermediate layer. Then, co-sputtering (binary simultaneous sputtering) using a Gd target and an Fe target was performed on the intermediate layer to form a second region of the first ferromagnetic layer with a thickness of 25 Å.

Then, a cap layer was formed on the first ferromagnetic layer. The cap layer was Mo with a thickness of 20 Å, Ta with a thickness of 20 Å, and Ru with a thickness of 20 Å in this order from the substrate side. Then, the annealing treatment was performed at 400° C. for 30 minutes in vacuum. Then, a first electrode was formed on the laminated body after the annealing treatment, and processed into a columnar shape having a diameter of 300 nm to produce a photodetection element. The first electrode was indium tin oxide (ITO) with a thickness of 500 Å. The film formation of each layer was performed by a DC magnetron sputtering apparatus.

The configurations of the photodetection elements produced in Example 1 are summarized below.
Second electrode: Ta (50 Å)/Ru (600 Å)/Ta (100 Å)
Base layer: Ta (20 Å)/Pt (20 Å)

Second ferromagnetic layer: [Co (5 Å)/Pt (4 Å)]4/Co (6 Å)/Ru (8 Å)/Co (6 Å)/[Pt (4 Å)/Co (5 Å)]$_3$/Mo (4 Å)/CoFeB (6 Å)/Fe (5 Å)

Spacer layer: MgO (12 Å)

First ferromagnetic layer: Co$_{0.24}$Fe$_{0.56}$B$_{0.20}$ (10 Å)/Mo (5 Å)/Gd$_{0.26}$Fe$_{0.74}$ (25 Å)

Cap layer: Mo (20 Å)/Ta (20 Å)/Ru (20 Å)

First electrode: ITO (500 Å)

The produced photodetection element was irradiated with pulsed light from the first electrode side. A 50 mW short pulse laser (wavelength 800 nm) was used as the light source. The light pulse width was 50 fsec, the light spot diameter was 2 mm, the intensity of the 50 mW pulsed light was dimmed to ¹/₁₀₀₀, and then the photodetection element was irradiated. A direct current of 0.25 mA was applied to the photodetection element. Then, the change in the output voltage from the photodetection element caused by irradiating the photodetection element with pulsed light was measured with a high-speed oscilloscope. In the photodetection element according to Example 1, the change in output voltage before and after pulse light irradiation was 5.0 mV.

Example 2

The second embodiment is different from the first embodiment in that the configuration of the second region of the first ferromagnetic layer was changed. In Example 2, co-sputtering (ternary simultaneous sputtering) using a Gd target, an Fe target, and a Co target was performed on the intermediate layer to form a second region of the first ferromagnetic layer with a thickness of 25 Å.

The layer structure of the first ferromagnetic layer in Example 2 is as follows, and the structure of the other layers is the same as that in Example 1.

First ferromagnetic layer: Co$_{0.24}$Fe$_{0.56}$B$_{0.20}$ (10 Å)/Mo (5 Å)/Gd$_{0.26}$(Fe$_{0.90}$Co$_{0.10}$)$_{0.74}$ (25 Å)

In Example 2, the pulsed light was applied in the same manner as in Example 1, and the change in the output voltage before and after the irradiation was measured. In the photodetection element according to the second embodiment, the change in the output voltage before and after the pulsed light irradiation was 4.8 mV.

Example 3

Example 3 is different from Example 1 in that the configuration of the second region of the first ferromagnetic layer was changed. In Example 3, Fe with a thickness of 3.7 Å and Gd with a thickness of 1.3 Å were alternately laminated five times on the intermediate layer to form a second region of the first ferromagnetic layer.

The layer structure of the first ferromagnetic layer in Example 3 is as follows, and the structure of the other layers is the same as that in Example 1.

First ferromagnetic layer: Co$_{0.24}$Fe$_{0.56}$B$_{0.20}$ (10 Å)/Mo (5 Å)/[Fe (3.7 Å)/Gd (1.3 Å)]$_5$ In Example 3, the pulsed light was applied in the same manner as in Example 1, and the change in the output voltage before and after the irradiation was measured. In the photodetection element according to Example 3, the change in output voltage before and after pulse light irradiation was 9.8 mV.

Example 4

Example 4 is different from Example 1 in that the configuration of the second region of the first ferromagnetic layer was changed. In Example 4, an alloy film of FeCo with a thickness of 3.7 Å and Gd with a thickness of 1.3 Å were alternately laminated five times on the intermediate layer to form a second region of the first ferromagnetic layer. bottom. The FeCo alloy film was formed by co-sputtering (two-way simultaneous sputtering) using a Fe target and a Co target.

The layer structure of the first ferromagnetic layer in Example 4 is as follows, and the structure of the other layers was the same as that in Example 1.

First ferromagnetic layer: Co$_{0.24}$Fe$_{0.56}$B$_{0.20}$ (10 Å)/Mo (5 Å)/[Fe$_{0.90}$Co$_{0.10}$ (3.7 Å)/Gd (1.3 Å)]$_5$ In Example 4, the pulsed light was applied in the same manner as in Example 1, and the change in the output voltage before and after the irradiation was measured. In the photodetection element according to Example 4, the change in output voltage before and after pulse light irradiation was 10.0 mV.

Comparative Example 1

Comparative Example 1 is different from Example 1 in that the configuration of the first ferromagnetic layer was changed. In Comparative Example 1, the intermediate layer and the second region of the first ferromagnetic layer 1 were not formed with respect to Example 1.

The layer structure of the first ferromagnetic layer in Comparative Example 1 is as follows, and the structure of the other layers was the same as that in Example 1. First ferromagnetic layer: Co$_{0.24}$Fe$_{0.56}$B$_{0.20}$ (10 Å)

In Comparative Example 1, the pulsed light was applied in the same manner as in Example 1, and the change in the output voltage before and after the irradiation was measured. In the photodetection element according to Comparative Example 1, the change in output voltage before and after pulse light irradiation was 2.5 mV.

The results of Examples 1 to 4 and Comparative Example 1 are summarized in the table below. As shown in Table 1, the photodetection elements of Examples 1 to 4 had higher efficiency of converting an optical signal into an electrical signal than the photodetection element of Comparative Example 1.

TABLE 1

|  | Change in output voltage before and after pulse light irradiation (mV) |
| --- | --- |
| Example 1 | 5.0 |
| Example 2 | 4.8 |
| Example 3 | 9.8 |
| Example 4 | 10.0 |
| Comparative Example 1 | 2.5 |

What is claimed is:

1. A photodetection element comprising:
a first ferromagnetic layer configured to be irradiated with light;
a second ferromagnetic layer; and
a spacer layer sandwiched between the first ferromagnetic layer and the second ferromagnetic layer, wherein
the first ferromagnetic layer includes a first region in contact with the spacer layer and a second region disposed in a position farther from the space layer than the first region,
the first region is made of CoFeB alloy, an elemental ratio of the CoFeB alloy is Co:Fe:B=15 to 55:25 to 65:15 to 25 under a condition that the sum of Co, Fe, and B corresponds to 100, the second region is a magnetic material containing Fe and Gd as major constituent elements, the second region is made of a plurality of sub-layers, and at least one of the sub-layers includes Fe and one of the sub-layers free of Fe includes Gd wherein when the magnetization state of the second region changes, the magnetization state of the first region that magnetically couples with the second region also changes.

2. The photodetection element according to claim 1 further comprising an intermediate layer between the first region and the second region, wherein the intermediate layer contains one or more elements selected from a group consisting of Mo, Ru, Ta, W and Pt.

3. The photodetection element according to claim 1, wherein the second ferromagnetic layer includes a third region in contact with the spacer layer and a fourth region containing boron and disposed in a position farther from the space layer than the third region, and the third region is free of boron or a concentration of boron in the third region is less than a concentration of boron in the fourth region.

4. The photodetection element according to claim 1, wherein a concentration of boron in the first region is more than a concentration of boron in the second region.

5. The photodetection element according to claim 3, wherein the third region contains Fe or a CoFe alloy, and a crystal structure of the third region is a bcc structure.

6. A receiver including the photodetection element according to of claim 1.

7. The photodetection element according to claim 1, wherein the spacer layer is made of a conductor or a semiconductor.

8. The photodetection element according to claim 1, wherein the elemental ratio of the CoFeB alloy is Co:Fe:B=24:56:20 under a condition that the sum of Co, Fe, and B corresponds to 100.

* * * * *